United States Patent [19]

Doyle

[11] Patent Number: 4,845,444

[45] Date of Patent: Jul. 4, 1989

[54] FREQUENCY DOUBLING CRYSTAL OSCILLATOR VIA A CURRENT MIRROR

[75] Inventor: James T. Doyle, Phoenix, Ariz.

[73] Assignee: Motorola, Inc., Schaumburg, Ill.

[21] Appl. No.: 164,686

[22] Filed: Mar. 7, 1988

[51] Int. Cl.[4] .................... H03B 5/36; H03B 25/00
[52] U.S. Cl. ................... 331/116 FE; 331/60;
   331/108 A; 331/159; 331/DIG. 3
[58] Field of Search ............ 331/60, 108 R, 108 A,
   331/108 L, 116 R, 116 FE, 117 R, 117 FE, 158,
   159, DIG. 3

[56] References Cited

U.S. PATENT DOCUMENTS 4,147,996  4/1979  Gontowski, Jr. .......... 331/108 A X
4,433,371  2/1984  Leuthold .................... 331/108 C X

*Primary Examiner*—Eugene R. LaRoche
*Assistant Examiner*—David Mis
*Attorney, Agent, or Firm*—William E. Koch

[57] ABSTRACT

A crystal oscillator comprising a crsytal and an inverter amplifier which utilizes a current mirror to provide a voltage output having a frequency double the frequency of the voltage waveform present in the inverter amplifier.

8 Claims, 2 Drawing Sheets

FREQUENCY DOUBLING CRYSTAL OSCILLATOR VIA A CURRENT MIRROR

BACKGROUND OF THE INVENTION

This invention relates to crystal oscillator circuits, and, in particular, to high frequency crystal oscillators.

Many electrical circuit applications require the use of frequency oscillators. Frequently, crystals are used to perform oscillator functions. Unfortunately, high frequency crystals are very difficult to make and are relatively fragile compared to low frequency crystals. Furthermore, for certain radio applications, lower frequency oscillators are required in order to achieve greater attenuation at the front end and lower power dissipation for the audio and signal processing stages (the back end).

SUMMARY OF THE INVENTION

It is an object of the present invention to provide a frequency doubling crystal oscillator which enables a circuit designer to utilize lower frequency crystals in high frequency applications.

It is a further object of the present invention to provide a crystal oscillator which requires less power than prior art devices.

These and other objects and advantages of the present invention are achieved by utilizing an inverter amplifier having an input coupled to the first end of a low frequency crystal, an output coupled to the second end of the low frequency crystal, a first source path coupled to an end-channel field effect transistor, and a second source path coupled to a current mirror. The current mirror helps create a voltage output having a frequency double the natural voltage resonant frequency of the crystal. This ability of attaining an output with a frequency double the frequency of the crystal will become apparent to those skilled in the art upon consideration of the accompanying specification, and drawings.

DESCRIPTION OF THE PREFERRED EMBODIMENT

Figure 2:
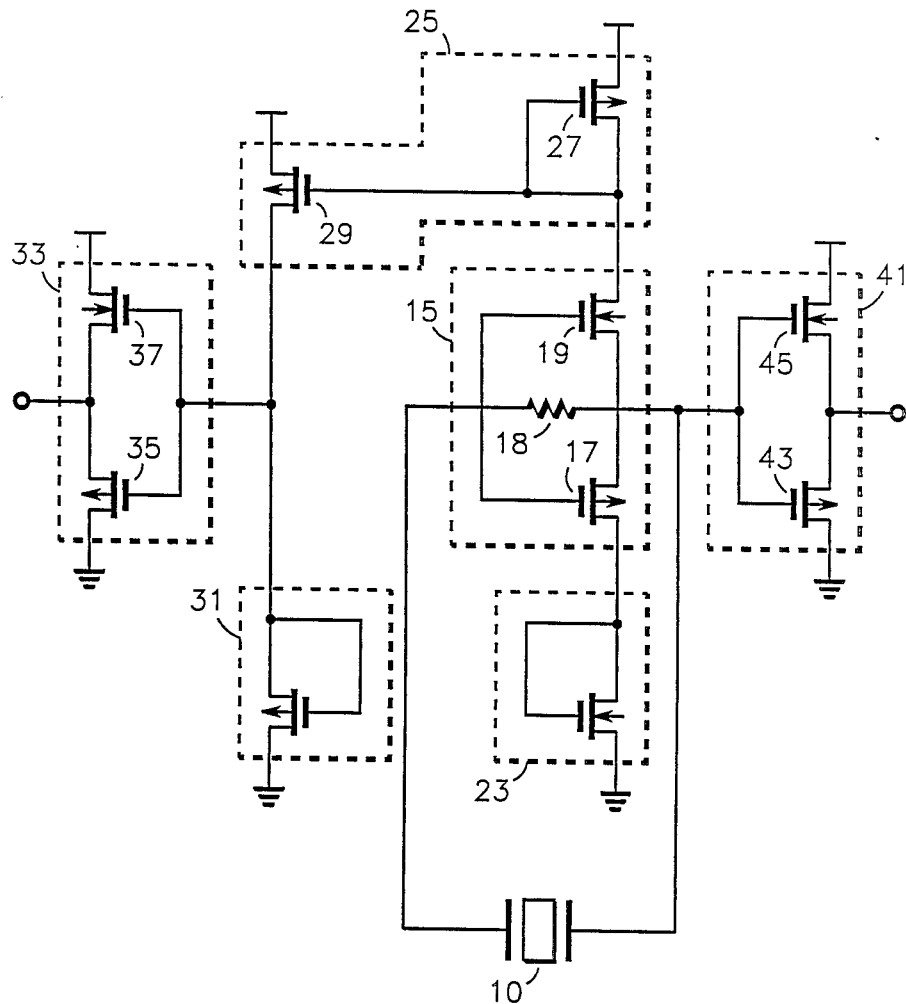
FIG. 2 is an electrical circuit diagram of a frequency doubling crystal oscillator embodying the present invention.

Referring specifically to FIG. 2, a crystal 10 is shown connected to the input and output of an inverter amplifier 15. Crystal 10 and inverter amplifier 15 together form a crystal controlled oscillator. Inverter amplifier 15 comprises a P-channel field effect transistor 17, an N-channel field effect transistor 19, and a balance resistor 18. The gates of transistors 17 and 19 are coupled to each other to form an input of inverter amplifier 15. Similarly, the drains of transistors 17 and 19 are coupled to each other to form an output of inverter amplifier 15. Balance resistor 18 is coupled between the gates of transistors 17 and 19 and the drains of transistors 17 and 19. Balance resistor 18 has a high impedance to insure that the voltage wave for at the input and output of inverter amplifier 15 are equal.

Inverter amplifier 15 has a first source path created by the source of transistor 19, and a second source path created by the source of transistor 17. An N-channel field effect transistor 23 is coupled to the second source path of inverter amplifier 15. Transistor 23 is diode connected having its gate and drain commonly coupled to the source of transistor 17. The source of transistor 23 is coupled to ground.

A current mirror 25 is coupled to the first source path of inverter amplifier 15. Current mirror 25 comprises a P-channel field effect transistor 27 and a P-channel field effect transistor 29. Transistor 27 is diode connected having a common gate and drain coupled to the source of transistor 19. The gate and drain of transistor 27 is also coupled to the gate of transistor 29.

A P-channel field effect transistor 31 is coupled to the source of transistor 29. Transistor 31 has a common gate and drain which is coupled to the source of transistor 29. The source of transistor 31 is coupled to ground.

An inverter amplifier 33 is coupled between transistors 29 and 31. Inverter amplifier 33 comprises a P-channel field effect transistor 35 and an N-channel field effect transistor 37 wherein the gates of transistors 35 and 37 are coupled to create an input to inverter amplifier 33, and the drains of transistors 35 and 37 are coupled together to form an output of inverter amplifier 33. The source of transistor 35 is coupled to ground.

Similar in function to inverter amplifier 33, an inverter amplifier 41 is coupled between the drains of transistors 17 and 19. Inverter amplifier 41 comprises a P-channel field effect transistor 43 and an N-channel field effect transistor 45 wherein the gates of transistors 43 and 45 are coupled to form an input of inverter amplifier 41, and the drains of transistors 43 and 45 are coupled to form an output of inverter amplifier 41. The source of transistor 43 is coupled to ground.

Although not mentioned up to this point, it should be apparent to those skilled in the art that the sources of transistors 27, 29, 37 and 45 are coupled to a predefined voltage supply which is capable of providing a desired current flow through the circuit.

Figure 1A:
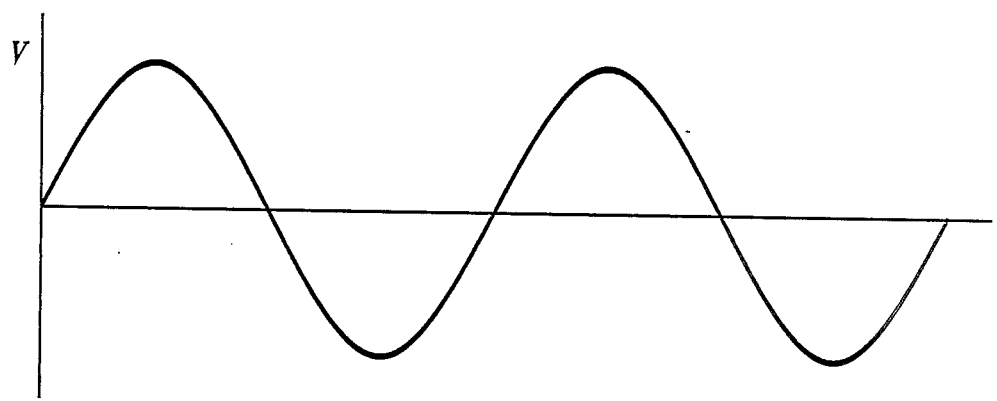
FIG. 1A represents the voltage waveform present in an inverter amplifier of a crystal oscillator used in the present invention.

The functioning of the circuit shown in FIG. 2 is described below:

Crystal 10 and inverter amplifier 15 create a crystal oscillator which provides a voltage sinusoidal waveform. This voltage waveform is illustrated in FIG. 1A. When a voltage is present at the input of inverter amplifier 15, transistors 17 and 19 turn on and a current will flow through transistors 17 and 19.

Figure 1B:
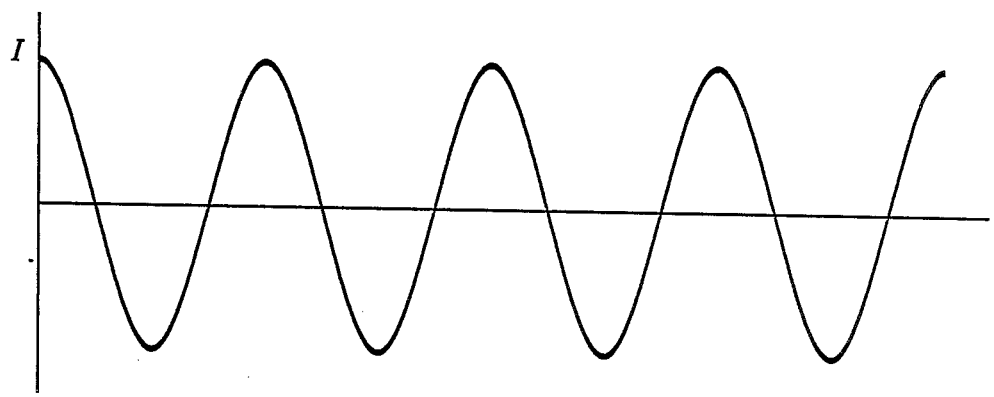
FIG. 1B represents the current waveform present in the inverter amplifier of the crystal oscillator used in the present invention.

Since transistors 17 and 19 are balanced P-type and N-type devices, it is known that the current in inverter amplifier 15 is maximum when the voltage at the input of inverter amplifier 15 is one half the supply voltage. Since crystal 10 provides a sinusoidal voltage waveform, the resulting current waveform present in inverter amplifier 15 is also a sinusoidal. The frequency of the resulting current waveform is twice the frequency of the voltage waveform since the voltage waveform crosses one half the supply voltage twice for each cycle. The current which flows through transistor 27, 19, 17, and 23 thus has a frequency twice that of the frequency of the voltage waveform. This principle is illustrated in FIG. 1B.

Since the gate of transistor 29 is coupled to the drain and gate of transistor 27, the current flow through transistor 29 will be the same as the current flow through transistor 27. Thus, element 25 is aptly called a current mirror. Again, it should be noted that the current flow through transistor 29 has a frequency double the frequency of the voltage waveform created by crystal 10.

By coupling diode connected transistor 31 to the source of transistor 29, a voltage at the input of inverter amplifier 33 swings rail to rail. This voltage is inverted through inverter amplifier 33 and forms an output voltage having a frequency double the frequency of the voltage caused by crystal 10.

Inverter amplifier 41 inverts the voltage output from inverter amplifier 15, and thus recreates the voltage waveform caused by crystal 10. Therefore, the circuit illustrated in FIG. 2 provides one voltage output having the same frequency as the voltage waveform of inverter amplifier 15 add a second voltage output having a frequency double the frequency of the voltage waveform of inverter amplifier 15.

It should be apparent to those skilled in the art that to properly balance inverter amplifier 15, transistor 27 is commonly two and one half times the size of transistor 23. Transistor 23 is utilized to limit the maximum current flow through the circuit and thus reduce maximum power. Furthermore, it should be clear to those skilled in the art that the circuit of FIG. 2 is not restricted to MOS P-channel and N-channel field effect transistors. Bipolar NPN and PNP transistors, MESFETS, etc. could also be utilized and yield the same results.

While a specific embodiment of this invention has been shown and described, further modifications, improvements, and applications will occur to those skilled in the art. For instance, the voltage waveform output having a frequency double the frequency created by crystal 10 can be sent through a toggle flip-flop to provide a highly reliable output at 50% duty cycle. This embodiment is extremely advantageous where it is vitally important to maintain a duty cycle such as in digital circuits which utilize precharge or synchronous techniques. Additionally, the circuit can be modified to attain a frequency double the frequency of the crystal oscillator on both halves of the circuit. I desire it to be understood, therefore, that this invention is not limited to the particular form shown and I intend to cover all modifications which do not depart from the spirit and scope of this invention.

I claim:

1. A crystal oscillator comprising:
   a crystal having first and second terminals;
   a first inverter amplifier having first and second source paths, an input, and an output wherein said input of said first inverter amplifier is coupled to said first terminal of said crystal and said output of said first inverter amplifier is coupled to said second terminal of said crystal.
   a current mirror coupled to said first source path of said inverter amplifier; and
   a first N-channel field effect transistor having a gate, a source, and a drain wherein said gate and said drain of said first N-channel field effect transistor are commonly coupled to said second source path of said first inverter amplifier, and said source of said first N-channel field effect transistor is coupled to a first source of voltage supply.

2. A crystal oscillator as recited in claim 1 wherein said first inverter amplifier comprises:
   a second N-channel field effect transistor having a source, a gate, and a drain wherein said source of said second N-channel field effect transistor creates said first source path of said first inverter amplifier;
   a first P-channel field effect transistor having a source, a gate, and a drain wherein said gate of said first P-channel field effect transistor is coupled to said gate of said second N-channel field effect transistor, said drain of said first P-channel field effect transistor is coupled to said drain of said second N-channel field effect transistor, and said source of said first P-channel field effect transistor creates said second source path of said first inverter amplifier; and
   a resistor having first and second ends, said first end of said resistor coupled to said gate of said first P-channel field effect transistor and said gate of said second N-channel field effect transistor, and said second end of said resistor coupled to said drain of said first P-channel field effect transistor and said drain of said second N-channel field effect transistor.

3. A claim as recited in claim 1 wherein said current mirror comprises:
   a second P-channel field effect transistor having a source, a gate, and a drain wherein said drain and said gate of said second P-channel field effect transistor are commonly coupled to said first source path of said first inverter amplifier, and said source of said second P-channel field effect transistor is coupled to a second source of voltage supply; and
   a third P-channel field effect transistor having a source, a gate, and a drain wherein said gate of said third P-channel field effect transistor is coupled to said gate and said drain of said second P-channel field effect transistor, said source of said third P-channel field effect transistor is coupled to said first source of voltage supply, and said drain of said third P-channel field effect transistor is coupled to said second source of voltage supply.

4. A claim as recited in claim 3 additionally comprising a fourth P-channel field effect transistor having a gate, a source, and a drain wherein said drain and said gate of said fourth field effect transistor are coupled to said source of said third P-channel field effect transistor, and said source of said fourth P-channel field effect transistor is coupled to said first source of voltage supply.

5. A claim as recited in claim 4 additionally comprising a second inverter amplifier having first and second source paths, an input, and an output, wherein said input of said second inverter amplifier is coupled between said source of said third P-channel field effect transistor and said drain of said fourth P-channel field effect transistor, said first source path of said second inverter amplifier is coupled to said second source of voltage supply, said second source path of said second inverter amplifier is coupled to said first source of voltage supply, and said output of said second inverter amplifier is capable of supplying an output.

6. A claim as recited in claim 5 wherein said second inverter amplifier comprises:
   a third N-channel field effect transistor having a source, a gate, and a drain wherein said source of said third N-channel field effect transistor forms said first source path of said second inverter amplifier; and
   a fifth P-channel field effect transistor having a source, a gate and a drain wherein said source of said fifth P-channel field effect transistor creates said second source path of said second inverter amplifier, said drain of said fifth P-channel field effect transistor is coupled to said drain of said third N-channel field effect transistor to create said output of said second inverter amplifier, and said gate of said fifth P-channel field effect transistor is coupled to said gate of said third N-channel field effect transistor to create said input of said second inverter amplifier.

7. A claim as recited in claim 1 additionally comprising a third inverter amplifier having first and second source paths, an input, and an output wherein said input of said third inverter amplifier is coupled between said output of said first inverter amplifier and said second end of said crystal, said first source path of said third inverter amplifier is coupled to said second source of voltage supply, said second source path of said third inverter amplifier is coupled to said first source of voltage supply, and said output of said third inverter amplifier is capable of supplying an output.

8. A claim as recited in claim 7 wherein said third inverter amplifier comprises:
   a fourth N-channel field effect transistor having a source, a gate and a drain wherein said source of said fourth N-channel field effect transistor creates said first source path of said third inverter amplifier; and
   a sixth P-channel field effect transistor having a source, a gate, and a drain wherein said source of said sixth field effect transistor creates said second source path of said third inverter amplifier, said drain of said sixth field effect transistor is coupled to said drain of said fourth N-channel field effect transistor to create said output of said third inverter amplifier, and said gate of said sixth P-channel field effect transistor is coupled to said gate of said fourth N-channel field effect transistor to create said input of said third inverter amplifier.

* * * * *